United States Patent
O'Brien

(10) Patent No.: US 11,563,154 B2
(45) Date of Patent: Jan. 24, 2023

(54) OPTOELECTRONIC COMPONENT AND METHOD OF PRODUCING AN OPTOELECTRONIC COMPONENT

(71) Applicant: OSRAM OLED GmbH, Regensburg (DE)

(72) Inventor: David O'Brien, Portland, OR (US)

(73) Assignee: OSRAM OLED GMBH, Regensburg (DE)

( * ) Notice: Subject to any disclaimer, the term of this patent is extended or adjusted under 35 U.S.C. 154(b) by 97 days.

(21) Appl. No.: 16/640,289

(22) PCT Filed: Sep. 6, 2018

(86) PCT No.: PCT/EP2018/074022
§ 371 (c)(1),
(2) Date: Feb. 19, 2020

(87) PCT Pub. No.: WO2019/052891
PCT Pub. Date: Mar. 21, 2019

(65) Prior Publication Data
US 2020/0287097 A1    Sep. 10, 2020

(30) Foreign Application Priority Data
Sep. 13, 2017 (DE) .......................... 102017121196.9

(51) Int. Cl.
*H01L 33/50* (2010.01)
*H01L 33/04* (2010.01)
*H01L 33/56* (2010.01)

(52) U.S. Cl.
CPC ............ *H01L 33/502* (2013.01); *H01L 33/04* (2013.01); *H01L 33/56* (2013.01); *H01L 2933/005* (2013.01); *H01L 2933/0041* (2013.01)

(58) Field of Classification Search
CPC ....... H01L 33/502; H01L 33/04; H01L 33/56; H01L 2933/0041; H01L 2933/005
See application file for complete search history.

(56) References Cited

U.S. PATENT DOCUMENTS

| 2015/0203747 | A1  | 7/2015  | Haley et al. |
| 2016/0230088 | A1  | 8/2016  | Puetz et al. |
| 2017/0110625 | A1  | 4/2017  | Zhao et al. |
| 2018/0371312 | A1  | 12/2018 | Dirscherl |
| 2020/0407627 | A1* | 12/2020 | Zhou .................... C09K 11/883 |

FOREIGN PATENT DOCUMENTS

DE      102015121720 A1    6/2017

* cited by examiner

*Primary Examiner* — Mark W Tornow
(74) *Attorney, Agent, or Firm* — Slater Matsil, LLP

(57) ABSTRACT

An optoelectronic component is disclosed. In an embodiment an optoelectronic component includes a semiconductor chip configured to emit radiation and a conversion element including quantum dots, the conversion element configured to convert a wavelength of the radiation, wherein each quantum dot includes a wavelength-converting core and an inorganic encapsulation, wherein inorganic encapsulations form a matrix material of at least adjacent quantum dots, and wherein the adjacent quantum dots have a distance of at least 10 nm.

16 Claims, 3 Drawing Sheets

A)

B)

C)

D)

E)

F)

OPTOELECTRONIC COMPONENT AND METHOD OF PRODUCING AN OPTOELECTRONIC COMPONENT

This patent application is a national phase filing under section 371 of PCT/EP2018/074022, filed Sep. 6, 2018, which claims the priority of German patent application 102017121196.9, filed Sep. 13, 2017, each of which is incorporated herein by reference in its entirety.

TECHNICAL FIELD

The invention relates to an optoelectronic component. Furthermore, the invention relates to a method of producing an optoelectronic component.

BACKGROUND

Optoelectronic components, such as light-emitting diodes, usually require a thick converter element for full conversion, in particular with a layer thickness of more than 100 μm.

In contrast, fully converting optoelectronic components for pixel applications require thin converter elements to reduce the so-called pixel-to-pixel crosstalk and thus improve the contrast.

The known converter elements are usually formed as foils, which are arranged on the radiation main side of the semiconductor chip of the optoelectronic component by means of an adhesive layer, for example, of silicone.

Alternatively, the converter elements can also comprise phosphors embedded in a polymer matrix, for example, of silicone, in which the semiconductor chip is embedded. The converter elements can be produced by dispensing, casting or spray coating phosphors embedded in silicone.

Both arrangements have the disadvantage that little heat flows from the converter element (stokes energy) through the matrix material, in particular polymers such as silicone, to the semiconductor chip heat sink and thus the application temperature and/or duration is limited.

SUMMARY OF THE INVENTION

Embodiments provide an optoelectronic component having improved properties. Further embodiments provide a method of producing an optoelectronic component which produces an improved optoelectronic component.

In at least one embodiment, the optoelectronic component comprises a semiconductor chip. The semiconductor chip is configured to emit radiation. The optoelectronic component comprises a conversion element. The conversion element comprises quantum dots. The quantum dots are configured for the wavelength conversion of radiation, in particular the radiation emitted by the semiconductor chip. The quantum dots each have a wavelength-converting core and an inorganic encapsulation. The inorganic encapsulation surrounds the core in particular in a cohesive and form-fitting manner. The inorganic encapsulation forms the matrix material of at least adjacent quantum dots. The adjacent quantum dots have a minimum distance of 10 nm or 11 nm.

Alternatively or additionally, adjacent quantum dots can have a distance of at most 15 nm.

In particular, the respective inorganic encapsulation surrounds the respective wavelength-converting core of a respective quantum dot.

Quantum dots here means a plurality, i.e. at least two, of quantum dots in the conversion element. The wavelength-converting core is preferably surrounded by the inorganic encapsulation in a cohesive and form-fitting manner. The quantum dots are arranged so close together that they have a distance of at least 10 nm and/or at most 15 nm from adjacent quantum dots. In particular, there is no further matrix material between adjacent quantum dots or between the quantum dots. If a further matrix material is used, this matrix material is in particular formed from the same or similar material as the inorganic encapsulation.

In particular, the distance is greater than 10 nm to avoid FRET energy transfer and quenching of quantum dot conversion efficiency. The closer the value of the distance between adjacent quantum dots is in the area of this lower limit, the more compact the conversion element is.

According to at least one embodiment, the quantum dots exhibit a large Stokes shift to avoid self-absorption losses. This point is essential for component efficiency in a conversion element that has a high concentration of quantum dots.

According to at least one embodiment, the proportion of quantum dots in the conversion element is greater than 5 vol %.

By using the here described quantum dots, they can be packed more densely and thus the layer thickness of the conversion element can be made smaller. Quantum dots preferably have a diameter between 1 nm inclusively and 10 nm inclusively. The absorbing shell can be thicker than 10 nm. This high-density packed conversion element with quantum dots can completely absorb the radiation emitted by the semiconductor chip preferably and convert it completely (full conversion).

However, to achieve a high efficiency of the component, energy transfer and quenching processes between the individual quantum dots must be prevented. This can be achieved by the inorganic encapsulation specified here, so that a distance between the emitting cores of the quantum dots is in particular between 5 nm and 10 nm. In addition, the inorganic encapsulation acts as a protection against water vapour and oxygen, i.e. environmental influences, in particular during the production of the coating, the lithography or the printing process. To produce a highly compact conversion element, the inorganic encapsulation in particular is thick enough to prevent degradation due to environmental influences and quenching effects. In particular, the inorganic encapsulation is not too thick to produce a conversion element with thin layer thickness.

According to at least one embodiment, the optoelectronic component has a semiconductor chip. The optoelectronic component can also have more than one semiconductor chip, for example, two or three semiconductor chips. The at least one semiconductor chip comprises a semiconductor layer sequence. The semiconductor layer sequence of the semiconductor chip is preferably based on a III-V compound semiconductor material. The semiconductor material is preferably a nitride compound semiconductor material, such as $Al_nIn_{1-n-m}Ga_mN$, or also a phosphide compound semiconductor material, such as $Al_nIn_{1-n-m}Ga_mP$, where $0 \le n \le 1$, $0 \le m \le 1$ and $n+m \le 1$ respectively. Likewise, the semiconductor material can be $Al_xGa_{1-x}As$, with $0 \le x \le 1$. The semiconductor layer sequence can contain dopants as well as additional components. For the sake of simplicity, however, only the essential components of the crystal lattice of the semiconductor layer sequence, i.e. Al, As, Ga, In, N or P, are given, even if these may be partially replaced and/or supplemented by small amounts of other substances.

The semiconductor layer sequence includes an active layer with at least one pn junction and/or with one or more quantum well structures. The optoelectronic component has an active layer in which an electromagnetic radiation is generated. A wavelength or the wavelength maximum of the radiation is preferably in the ultraviolet and/or visible and/or IR range, in particular at wavelengths between 420 nm inclusive and 680 nm inclusive, for example, between 440 nm inclusive and 480 nm inclusive.

According to at least one embodiment, the optoelectronic component is a light-emitting diode, or LED for short.

The optoelectronic component is then preferably configured to emit blue, red, green, orange or white light. It should be noted at this point that optoelectronic components include not only finished components, such as finished LEDs or laser diodes, but also substrates and/or semiconductor layers, so that, for example, a combination of a copper layer and a semiconductor layer can already constitute an optoelectronic component and form part of a higher-level second optoelectronic component in which, for example, additional electrical connections are provided. The semiconductor chip may in particular be a thin-film light-emitting diode chip.

According to at least one embodiment, the semiconductor chip has a radiation exit surface. The radiation exit surface is preferably oriented perpendicular to a growth direction of the semiconductor layer sequence of the semiconductor chip. The semiconductor chip preferentially emits electromagnetic radiation from the ultraviolet or blue wavelength range, wherein this radiation is coupled out of the optoelectronic component via the radiation exit surface.

According to at least one embodiment, the conversion element is arranged in direct electrical or mechanical contact with the radiation exit surface of the semiconductor chip. In addition, the conversion element can also cover the lateral surfaces, i.e. the surfaces of the semiconductor chip oriented parallel to the growth direction of a semiconductor layer sequence. In other words, the conversion element surrounds the semiconductor chip preferably in a cohesive and form-fitting manner.

According to at least one embodiment, the optoelectronic component comprises a conversion element. The conversion element comprises or consists of quantum dots. In particular, the conversion element is free of a matrix. In other words, the inorganic encapsulation forms the matrix or matrix material.

The quantum dots comprise, or each quantum dot comprises, a wavelength-converting core and an inorganic encapsulation. The inorganic encapsulation surrounds the wavelength-converting core in a cohesive and form-fitting manner, so that the wavelength-converting core is protected from environmental influences and moisture. Furthermore, the inorganic encapsulation is the matrix material, so that preferably no further matrix material is required. Furthermore, the inorganic encapsulation forms a so-called buffer between adjacent wavelength-converting cores, so that quenching processes or energy transfer processes are avoided by generating the distance between the wavelength-converting cores of the respective quantum dots.

According to at least one embodiment, the encapsulation comprises centers for optical scattering to increase the optical path length and thus increase the absorption in the conversion element.

In particular, adjacent quantum dots have a maximum distance of 50 nm, 40 nm, 30 nm, 20 nm, 15 nm, 12 nm, 11 nm, 10 nm, 9 nm, 8 nm, 7 nm, 6 nm, 5 nm, 4 nm with a tolerance of 1%, 2%, 3%, 4% or 5% deviation from the values just indicated. 'Distance' here can mean the distance between adjacent quantum dots. In particular, this can mean the distance between the respective centers of the cores of the wavelength-converting quantum dots, i.e. the core-core distance. Alternatively, 'distance' here can preferably also mean the distance between the outer surfaces of the respective cores (outer surface-outer surface distance). In particular, the active quantum dot surface to the active adjacent quantum dot surface is >10 nm to avoid FRET energy transfer.

Alternatively or additionally, adjacent quantum dots have a minimum distance of 10 nm, 11 nm, 12 nm, 13 nm, 14 nm with a tolerance of 1%, 2%, 3%, 4% or 5% deviation from the values just mentioned.

Quantum dots are particularly sensitive conversion materials, i.e. conversion materials sensitive to oxygen, moisture and/or acid gases. Preferably, the quantum dots are nanoparticles, i.e. particles in a large nanometre range with a particle diameter d50 of, for example, between at least 1 nm and at most 1000 nm, in particular between at least 1 nm and at most 30 nm, for example between 5 nm and 15 nm.

The quantum dots comprise a semiconductor core having wavelength-converting properties. In particular, the quantum dot core comprises, or consists of, a III/IV or III/V semiconductor body. For example, the quantum dots or the cores of the respective quantum dots are selected from a material of the following group: indium phosphide, cadmium sulphide, cadmium selenide, indium gallium arsenide, gallium indium phosphide, copper indium selenide.

The semiconductor core can be covered by one or more layers as a coating. The covering of the semiconductor core preferably consists of an inorganic encapsulation. The quantum dots here are preferably free of organic materials. In other words, the semiconductor core can have an inorganic encapsulation on its outer surface, which completely or almost completely surrounds the wavelength-converting core of the respective quantum dot.

The semiconductor core can be a monocrystalline or polycrystalline agglomerate.

According to at least one embodiment, the quantum dots have an average diameter of 3 nm to 10 nm, particularly preferably 3 nm to 5 nm. By varying the size of the quantum dots, the wavelength of the converted radiation can be specifically varied and thus adapted to the respective applications. The quantum dots can be spherical or rod-shaped.

According to at least one embodiment, the respective wavelengthwave-converting cores of adjacent quantum dots have a maximum distance of 15 nm. Alternatively, the distance can be at least 5 nm, 6 nm, 7 nm or 8 nm and at most 15 nm, 14 nm, 13 nm, 12 nm or 11 nm.

According to at least one embodiment, the conversion element has a layer thickness that corresponds to a maximum of 30% of the layer thickness of the semiconductor chip.

According to at least one embodiment, the layer thickness of the conversion element is between 0.8 μm and 10 μm or between 0.1 μm and 10 μm.

According to at least one embodiment, the component is configured for full conversion. In particular, this means here that the radiation emitted by the semiconductor chip is completely or almost completely converted in the conversion element, i.e. more than 90%, more than 95%, more than 99% or exactly 100%.

Alternatively, the component can be configured for partial conversion. This means that the radiation emitted by the semiconductor chip is only partially converted by the conversion element and part of the radiation is transmitted, i.e. is not converted, so that mixed radiation emerges from the component. The mixed radiation comprises radiation emitted by the semiconductor chip and radiation converted by the conversion element.

According to at least one embodiment, the wavelength-converting cores of the respective quantum dots have a diameter of 5 nm to 10 nm. According to at least one embodiment, the inorganic encapsulation of the respective quantum dots has a diameter of 5 nm to 15 nm. In particular, the diameter of the inorganic encapsulation is on average larger than the diameter of the cores.

According to at least one embodiment, the conversion element is arranged directly, i.e. in direct mechanical or electrical contact, on a radiation main side of the semiconductor chip.

According to at least one embodiment, the respective inorganic encapsulation protects the core of the quantum dots from degradation.

According to at least one embodiment, the inorganic encapsulation is formed from a silicate-sol-gel material by a wet chemical process. Preferably, the inorganic encapsulation is formed from silicon dioxide. Alternatively, other optically transparent oxides such as aluminium oxide, $TiO_2$ or ZrO can be used.

Alternatively or additionally, the inorganic encapsulation comprises optical scattering centers which increase the optical path length and thus the absorption in the conversion element.

According to at least one embodiment, the inorganic encapsulation is formed from TEOS (tetraethyl orthosilicate) as precursor or an oxidic precursor material.

According to at least one embodiment, the quantum dots each comprise a wavelength-converting core surrounded by an inorganic encapsulation, which in particular forms an absorbing protective structure. This, in turn, can be surrounded by an encapsulation, which is in particular shaped oxidically.

According to at least one embodiment, the inorganic encapsulation serves to prevent the degradation of the quantum dots due to environmental influences during production. In addition, the inorganic encapsulation serves as a mechanical binder between adjacent quantum dots and the semiconductor chip. In this case, the conversion element has an oxidic or encapsulated layer with quantum dots embedded therein.

The inventor has recognized that by using the quantum dots described here, the quantum dots can be arranged very close together without generating a quench or energy transfer. This leads to a high concentration of quantum dots in the conversion element, so that the conversion element can be formed in thin layers. Thin-layer means here in particular smaller than 5 µm.

Further embodiments relate to a method of producing an optoelectronic component. The optoelectronic component described here is preferably produced by this method. All definitions and embodiments for the optoelectronic component also apply to the method and vice versa. In at least one embodiment, the method comprises the following steps, in particular in the order given here:

A) Providing a semiconductor chip which is configured to emit radiation and which can optionally have individual controllable pixel;

B) Providing a conversion element on the semiconductor chip, for this purpose:

B1) Providing a plurality of wavelength-converting cores of quantum dots which are configured for the wavelength conversion of radiation of the semiconductor chip;

B2) Applying an inorganic partial encapsulation around the respective core;

B3) Applying a solution of the material of the inorganic partial encapsulation to the semiconductor chip;

B4) Reaction of the solution of the material of the inorganic partial encapsulation with the respective core of the quantum dots which are surrounded by the respective inorganic partial encapsulation so that an inorganic encapsulation is produced. In particular, the inorganic encapsulation surrounds the respective wavelength-converting core of the quantum dots in a cohesive and form-fitting manner.

The steps B1 to B4 can be performed in the specified sequence. Alternatively, B2 can also take place before B1.

According to at least one embodiment, the method is wet-chemical. For example, the cores of the quantum dots can be treated with silicate-sol-gel materials in a wet-chemical state and applied to the radiation exit surface of the semiconductor chip. The conversion element can then be shaped to produce the quantum dots with the inorganic encapsulation, preferably from silicon dioxide or other oxides. In addition, the inorganic encapsulation forms the matrix material for the quantum dots. A further matrix material is therefore not required. TEOS or other oxide precursor materials can be used as sol-gel material.

By reducing the inorganic encapsulation between the wavelength-converting cores and between the cores and the semiconductor chip, the thermal path for the Stokes heat from the conversion process can be reduced.

By improving the thermal path, the temperature of the converter can be reduced under given operating conditions, so that both the temperature-dependent wavelength shifts of the converter can typically be reduced by about 0.1 nm/Kelvin and the temperature-dependent intensity quenching of the quantum dots.

The inventor has recognized that by combining the quantum dots described here, which exhibit a large Stokes shift and a low reabsorption, with a thin-layer inorganic encapsulation, a component with a high thermal path can be produced. The distance between the cores of the quantum dots described here even prevents a non-radiative energy transfer between the quantum dots, which would lead to reduced efficiency.

In addition, the quantum dots described here can be used with inorganic encapsulation to create a distance between the cores of adjacent quantum dots, thus preventing quenching, oxidation or other chemical degradation. In addition, a better heat transfer of the stokes energy from the conversion element to the semiconductor chip heat sink is possible, so that negative temperature effects in the conversion element are prevented or reduced.

According to at least one embodiment, the conversion element is matrix-free.

BRIEF DESCRIPTION OF THE DRAWINGS

Further advantages, advantageous embodiments and developments result from the exemplary embodiments described in the following in connection with the figures.

In the exemplary embodiments and figures, identical, similar or equivalent elements can each be provided with the same reference numbers. The represented elements and their proportions among each other are not to be regarded as true to scale. Rather, individual elements, such as layers, components, components and areas, can be displayed in an exaggeratedly large format for better representability and/or better understanding.

DETAILED DESCRIPTION OF ILLUSTRATIVE EMBODIMENTS

Figure 1:
FIGS. 1A to 1F each show quantum dots according to an embodiment or a comparative example.
Figure 1:
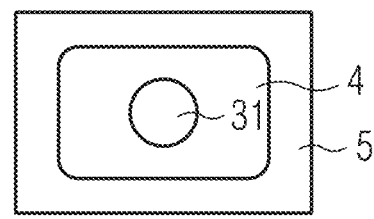
Figure 1:
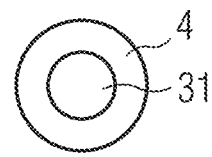
Figure 1:
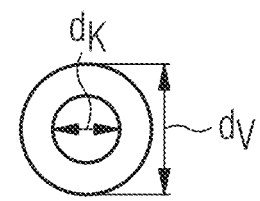
Figure 1:
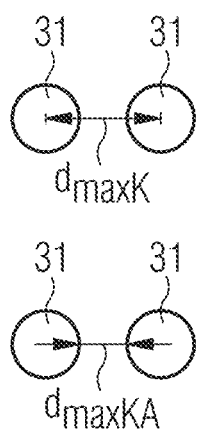
Figure 1:
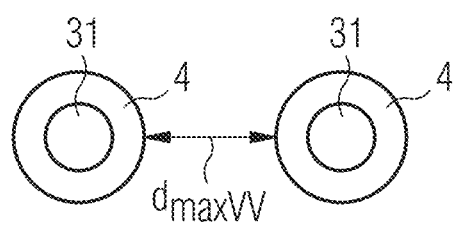

FIG. 1A shows a schematic side view of a quantum dot 3. In particular, only the wavelength-converting core 31 is shown here. The wavelength-converting core 31 comprises or consists of indium phosphide, cadminum selenide, cadmium sulphide and/or copper indium selenide or combinations thereof.

According to FIG. 1B, an inorganic encapsulation 4 is arranged around the wavelength-converting core 31. The inorganic encapsulation can be formed, for example, from silicon dioxide or SolGel oxides (e.g., TEOS based). A matrix material 5 can be arranged around the inorganic encapsulation 4, as in this case.

The quantum dots can have a core of CdSe or InP with a diameter of 2-10 nm. This allows the emission spectra to be defined. The core can be surrounded by a CdS or ZnS shell which defines the optical absorption and protects the core.

The quantum dots may be encapsulated in an oxide to protect them from the environment.

The oxide can grow together to form the matrix and protect the individual quantum dots and ensure that the outer quantum dot surfaces are separated by >10 nm.

According to FIG. 1C, a quantum dot 3 is shown with a wavelength-converting core 31 and an inorganic encapsulation 4. The inorganic encapsulation 4, which consists exclusively of inorganic materials, i.e., contains no organic materials, surrounds the wavelength-converting core 31 in a cohesive and form-fitting manner.

According to FIG. 1D, a quantum dot is shown here which has the diameter $d_K$ of the wavelength-converting core 31. The diameter of the inorganic encapsulation 4 $d_V$ is also shown. These diameters are to be assumed in particular if the quantum dots are shaped as spherical spheres. Alternatively, these diameters can also be assumed if the quantum dots are rod-shaped.

FIG. 1E shows the distance from adjacent quantum dots. The 'distance from adjacent quantum dots' can be the shortest distance from adjacent wavelength-converting cores 31, measured from the center of the respective wavelength-converting core ($d_{maxK}$). Alternatively, in particular, the shortest distance between the respective outer sides or outer surfaces of the wavelength-converting cores 31 can be meant ($d_{maxKA}$).

FIG. 1F shows the distance between adjacent quantum dots ($d_{maxVV}$), i.e., the shortest distance measured from the outer sides of the inorganic encapsulation of the respective quantum dots. In particular, $d_{maxVV}$ is <10 nm.

Figure 2:
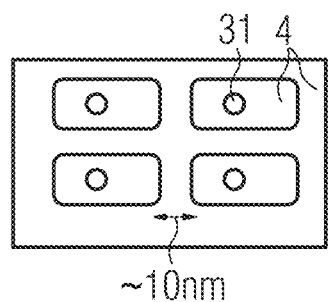
FIGS. 2A, 2C, 2D each show a schematic side view of a conversion element according to an embodiment.
FIG. 2B shows a schematic side view of an optoelectronic component according to an embodiment.
Figure 2:
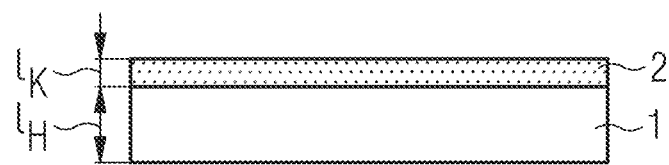
Figure 2:
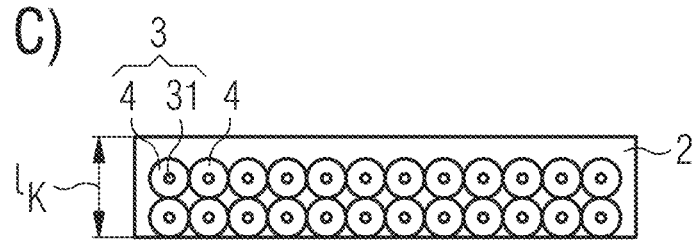
Figure 2:
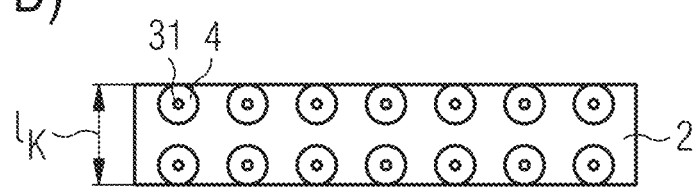

FIG. 2A shows a schematic side view of a conversion element according to an embodiment. Four quantum dots 3 are shown here. Each quantum dot has a wavelength-converting core 31 and an inorganic encapsulation 4. The inorganic encapsulation surrounds the respective wavelength-converting core 31 in a cohesive and form-fitting manner. A matrix material 5 may be present around the encapsulation 4. The matrix material 5 is preferably formed from the same material as the inorganic encapsulation 4. In other words, the inorganic encapsulation 4 connects the quantum dots with each other, so that further matrix materials are not necessary. In addition, the quantum dots have a minimum distance or a maximum distance of, for example, 10 nm, with a tolerance of 1%, 2%, 3%, 4% or 5% deviation from this value.

FIG. 2B shows a schematic side view of an optoelectronic component according to an embodiment. A semiconductor chip 1 is shown here, which is configured to emit radiation, in particular radiation from the blue wavelength range. A conversion element 2 is arranged on the semiconductor chip 1, especially directly on the radiation exit surface of the semiconductor chip 1. The conversion element 2 comprises the quantum dots described here with the wavelength-converting core 31 and the inorganic encapsulation 4. The layer thickness of the semiconductor chip $1l_H$ is many times greater than the layer thickness of the conversion element $2l_K$. Preferably, the conversion element 2 comprises a layer thickness that corresponds to a maximum of 10%, 20%, 30%, 40%, 50% or 60% of the layer thickness of the semiconductor chip. For example, the layer thickness of the semiconductor chip has a thickness of 5 µm. Then, for example, the layer thickness of the conversion element 2 comprises a layer thickness of approximately 1 µm. Alternatively, the relation between the pixel "footprint" (x-y dimension) and the conversion element thickness (z) can also be made. For 5×5 µm pixels, for example, the layer thickness of the conversion element is then less than 5 µm.

FIG. 2C shows a schematic side view of a conversion element 2 according to an embodiment. Here the quantum dots with the wavelength-converting core 31 and the inorganic encapsulation 4 are arranged in direct mechanical or electrical contact with each other.

In comparison, FIG. 2D shows that the inorganic encapsulations 4 of the respective quantum dots, which are arranged adjacent to each other, are spaced apart. The intermediate regions between adjacent inorganic encapsulations can be filled with a material that is the same as the material of the inorganic encapsulation.

FIGS. 3A to 3G show a schematic side view of an optoelectronic component 100 according to an embodiment.

Figure 3:
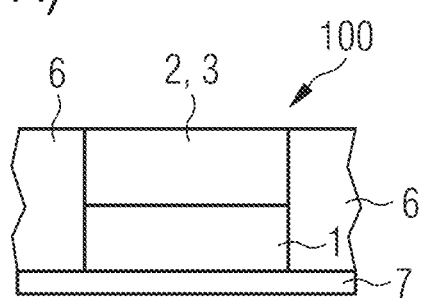
FIGS. 3A to 3G each show a schematic side view of an optoelectronic component according to an embodiment.
Figure 3:
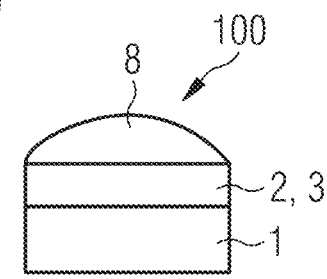
Figure 3:
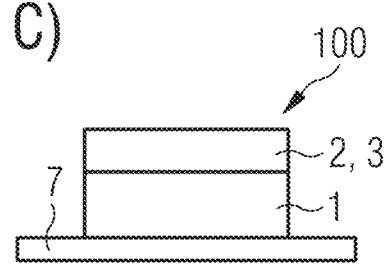
Figure 3:
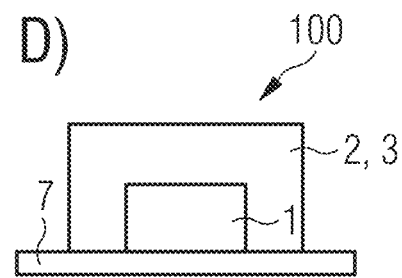
Figure 3:
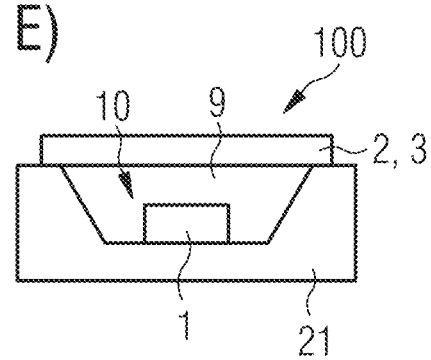
Figure 3:
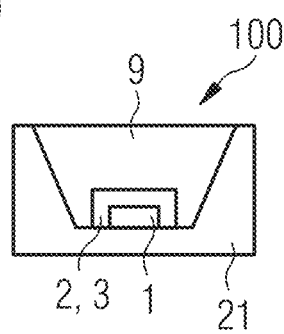
Figure 3:
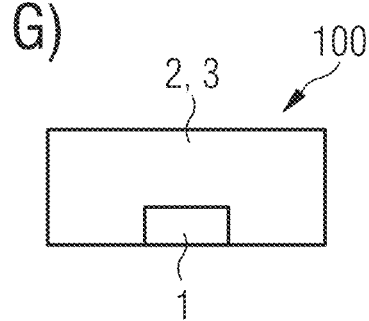

The component in FIG. 3A comprises a carrier 7 on which a semiconductor chip 1 is arranged. The semiconductor chip 1 is configured to emit radiation, in particular radiation from the blue wavelength range. The semiconductor chip 1 can be pixelated. In the beam path of the semiconductor chip 1, the conversion element 2 is arranged in particular directly on the radiation exit surface. The lateral surfaces of the semiconductor chip 1 and the conversion element 2 are surrounded by a reflection element 6. The reflection element 6 may contain silicone and scattering particles embedded therein, for example, titanium dioxide, silicon dioxide, zirconium oxide or aluminium oxide.

As shown in FIG. 3B, a conversion element 2 and a lens 8 are arranged on a semiconductor chip 1. The lens 8 can be formed from silicone, for example.

According to FIG. 3C, the carrier 7 has a greater lateral extent than the lateral extent of the semiconductor chip 1 and the conversion element 2. In this case, the lateral extent of the semiconductor chip 1 and the conversion element 2 is the same, but can also be different. For example, the conversion element 2 can extend beyond the semiconductor chip 1.

According to FIG. 3D, the conversion element 2 surrounds the radiation exit surface and the lateral surface of the semiconductor chip 1 in a cohesive and form-fitting manner. In other words, the conversion element 2 completely surrounds the semiconductor chip 1.

According to FIG. 3E, the component comprises a housing 21 with a recess 10. The semiconductor chip 1 is located in the recess 10. The semiconductor chip 1 can be encapsulated within the recess 10 with a potting material 9. The conversion element 2 can be arranged on the housing 21 at a distance from the semiconductor chip 1.

According to FIG. 3F, the conversion element 2 completely surrounds the lateral surfaces and radiation exit surface of the semiconductor chip 1 within a housing 21. In addition, the conversion element 2 can be provided with a potting 9 within the recess.

According to FIG. 3G, the semiconductor chip 1 is completely embedded in the conversion element 2. Compared to the component in FIG. 3D, the carrier 7 is missing.

The exemplary embodiments described in connection with the figures and their features can also be combined with each other according to further exemplary embodiments, even if such combinations are not explicitly disclosed in connection with the figures. Furthermore, the exemplary embodiments described in connection with the figures can have additional or alternative features according to the description in the general part.

The invention is not limited by the description based on the exemplary embodiments of these. Rather, the invention includes any new feature as well as any combination of features, which in particular includes any combination of features in the patent claims, even if this feature or this combination itself is not explicitly specified in the patent claims or exemplary embodiments.

The invention claimed is:

1. An optoelectronic component comprising:
   a semiconductor chip configured to emit radiation; and
   a conversion element comprising quantum dots, the conversion element configured to convert a wavelength of the radiation,
   wherein each quantum dot comprises a wavelength-converting core and an inorganic encapsulation,
   wherein the adjacent quantum dots have a distance of at least 10 nm,
   wherein a matrix material directly connects the quantum dots with each other, and
   wherein the matrix material is formed from the same material as the inorganic encapsulation.

2. The optoelectronic component according to claim 1, wherein wavelength-converting cores of the adjacent quantum dots comprise a distance of at least 10 nm and/or at most 15 nm.

3. The optoelectronic component according to claim 1, wherein the conversion element comprises a thickness which corresponds to at most 30% of a thickness of the semiconductor chip.

4. The optoelectronic component according to claim 1, wherein a thickness of the conversion element is between 0.1 μm and 10 μm.

5. The optoelectronic component according to claim 1, wherein the wavelength-converting cores of the quantum dots comprise InP, CdS, CdSe, InGaAs, GaInP or CuInSe.

6. The optoelectronic component according to claim 1, wherein the optoelectronic component is configured to fully convert the radiation so that the radiation is completely converted in the conversion element.

7. The optoelectronic component according to claim 1, wherein the semiconductor chip is pixelated.

8. The optoelectronic component according to claim 1, wherein the wavelength-converting cores of the quantum dots comprise a diameter of 5 nm to 10 nm.

9. The optoelectronic component according to claim 1, wherein the inorganic encapsulations comprise a diameter of 5 nm to 15 nm, and wherein the diameter of the inorganic encapsulation is on average larger than a diameter of the wavelength-converting cores.

10. The optoelectronic component according to claim 1, wherein the conversion element is arranged directly on a radiation main side of the semiconductor chip.

11. The optoelectronic component according to claim 1, wherein the inorganic encapsulations protect the wavelength-converting cores from degradation.

12. The optoelectronic component according to claim 1, wherein the inorganic encapsulations are formed from a silicate sol-gel material by a wet chemical process and/or wherein the inorganic encapsulations comprises optical scattering centers.

13. The optoelectronic component according to claim 1, wherein the inorganic encapsulations are formed from TEOS or an oxidic precursor material.

14. A method for producing the optoelectronic component according to claim 1, the method comprising:
   providing the semiconductor chip; and
   providing the conversion element on the semiconductor chip by:
      providing the wavelength-converting cores of the quantum dots;
      applying an inorganic partial encapsulation around the wavelength-converting cores;
      applying a solution of a material of the inorganic partial encapsulation to the semiconductor chip; and
      reacting the solution of the material of the inorganic partial encapsulation with the wavelength-converting cores of the quantum dots which are surrounded by the inorganic partial encapsulation so that the inorganic encapsulations are produced.

15. The optoelectronic component according to claim 1, wherein the matrix material is free of organic materials.

16. The optoelectronic component according to claim 1, wherein a region between adjacent quantum dots is completely filled with the matrix material.

* * * * *